(12) United States Patent
Jaster

(10) Patent No.: US 10,768,239 B2
(45) Date of Patent: Sep. 8, 2020

(54) BATTERY SYSTEM WITH A VOLTAGE EQUALIZING CIRCUIT

(71) Applicant: Continental Automotive GmbH, Hannover (DE)

(72) Inventor: Magnus Jaster, Kirchmöser (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 115 days.

(21) Appl. No.: 16/078,739

(22) PCT Filed: Feb. 21, 2017

(86) PCT No.: PCT/EP2017/053950
§ 371 (c)(1),
(2) Date: Aug. 22, 2018

(87) PCT Pub. No.: WO2017/144473
PCT Pub. Date: Aug. 31, 2017

(65) Prior Publication Data
US 2019/0047438 A1    Feb. 14, 2019

(30) Foreign Application Priority Data
Feb. 23, 2016 (DE) .......................... 10 2016 202 761

(51) Int. Cl.
*H02J 7/00* (2006.01)
*G01R 31/36* (2020.01)
(Continued)

(52) U.S. Cl.
CPC ............ *G01R 31/396* (2019.01); *B60L 58/12* (2019.02); *B60L 58/22* (2019.02);
(Continued)

(58) Field of Classification Search
USPC ......................................................... 318/139
See application file for complete search history.

(56) References Cited

U.S. PATENT DOCUMENTS

| 8,598,846 B1 | 12/2013 | Hartley et al. ................. 320/122 |
| 2011/0260770 A1* | 10/2011 | Sekiguchi .......... G01R 31/3835 327/333 |

(Continued)

FOREIGN PATENT DOCUMENTS

| EP | 2595275 A1 | 5/2013 | ................ H02J 7/00 |
| EP | 2632021 A1 | 8/2013 | ................ H02J 7/02 |
| WO | 2017/144473 A1 | 8/2017 | ................ H02J 7/00 |

OTHER PUBLICATIONS

German Office Action, Application No. 102016202761.1, 6 pages, dated Nov. 30, 2016.
(Continued)

*Primary Examiner* — Jorge L Carrasquillo
(74) *Attorney, Agent, or Firm* — Slayden Grubert Beard PLLC

(57) ABSTRACT

Various embodiments may include a battery system comprising: a battery cell; and a voltage balancing circuit for balancing a voltage at the battery cell. The voltage balancing circuit includes: a balancing current path electrically connected between a positive power connection terminal and a negative power connection terminal of the battery cell, two resistors, and a controllable balancing switch connected in series with the two resistors; and a measuring arrangement electrically connected on a signal-input side to an electrical connecting point between the two resistors and configured to detect a first voltage potential at the electrical connecting point.

5 Claims, 2 Drawing Sheets

(51) Int. Cl.
  *G01R 19/165* (2006.01)
  *G01R 31/396* (2019.01)
  *B60L 58/12* (2019.01)
  *B60L 58/22* (2019.01)

(52) U.S. Cl.
  CPC ...... *G01R 19/16542* (2013.01); *H02J 7/0016* (2013.01); *H02J 7/0021* (2013.01); *H02J 7/0029* (2013.01); *Y02T 10/7055* (2013.01)

(56) References Cited

U.S. PATENT DOCUMENTS

| | | | |
|---|---|---|---|
| 2012/0194135 A1* | 8/2012 | Mizoguchi | B60L 58/22 320/118 |
| 2012/0293128 A1 | 11/2012 | Kim et al. | 320/117 |
| 2013/0162213 A1* | 6/2013 | Izawa | H02J 7/0016 320/118 |
| 2014/0152261 A1 | 6/2014 | Yamauchi et al. | 320/118 |
| 2014/0327400 A1* | 11/2014 | Kudo | H02J 7/0014 320/118 |

OTHER PUBLICATIONS

International Search Report and Written Opinion, Application No. PCT/EP2017/053950, 21 pages, dated May 17, 2017.

\* cited by examiner

BATTERY SYSTEM WITH A VOLTAGE EQUALIZING CIRCUIT

CROSS-REFERENCE TO RELATED APPLICATIONS

This application is a U.S. National Stage Application of International Application No. PCT/EP2017/053950 filed Feb. 21, 2017, which designates the United States of America, and claims priority to DE Application No. 10 2016 202 761.1 filed Feb. 23, 2016, the contents of which are hereby incorporated by reference in their entirety.

TECHNICAL FIELD

The present disclosure relates to battery systems. Various embodiments may include systems having a voltage balancing circuit for providing electrical energy, in particular for a hybrid electric vehicle/electric vehicle, and to an electric drive arrangement having a mentioned battery system, in particular for driving a hybrid electric vehicle/electric vehicle. The invention also relates to a method for identifying a faulty state of the at least one voltage balancing circuit, in particular of a measuring arrangement of the voltage balancing circuit for cell voltage measurement.

BACKGROUND

Battery systems, in particular traction batteries for hybrid electric vehicles/electric vehicles, generally comprise one or more battery cells (or battery cell blocks) connected in series. The battery cells are operated only within certain voltage limits, since they otherwise age significantly more quickly or even cause a thermal reaction. This thermal reaction, for example in the form of a fire, should be avoided. Owing to different manufacturing tolerances and different aging processes, the individual battery cells also have fluctuations in their charge capacitances and internal resistances. On account of the series circuit, the different charge capacitances and the different internal resistances again lead to the battery cells being charged and discharged differently and, in extreme cases, being able to occupy critical states of charge (for example due to overcharging).

SUMMARY

The teachings of the present disclosure describe a safe battery system operable in a cost-effective manner and operating same in a safe manner. For example, some embodiments include a battery system (BS), in particular for a hybrid electric vehicle/electric vehicle, comprising: one or at least two battery cells (Z0, Z1, Z2) connected in series and at least one voltage balancing circuit (SA) for balancing the voltage (Uz1) at the one or at one of the at least two battery cells (Z1) connected in series; wherein the at least one voltage balancing circuit (SA) comprises a balancing current path (SP) and a measuring arrangement (MA); wherein the balancing current path (SP) is electrically connected between a positive power connection terminal (PA) and a negative power connection terminal (NA) of the one or of one of the at least two battery cells (Z1) and comprises two resistors (R1, R2) and a controllable balancing switch (T1), wherein the two resistors (R1, R2) and the balancing switch (T1) are connected in series with one another; and the measuring arrangement (MA) is electrically connected on the signal-input side to an electrical connecting point (VP) between the two resistors (R1, R2) and is configured to detect a first voltage potential ($\Phi 1$) at the electrical connecting point (VP).

In some embodiments, the measuring arrangement (MA) is also electrically connected on the signal-input side to the negative power connection terminal (NA) of the one or of one of the at least two battery cells (Z1) and is also configured to detect a second voltage potential ($\Phi 2$) at the negative power connection terminal (NA).

In some embodiments, the measuring arrangement (MA) comprises an analog-to-digital converter (AD), which is electrically connected to the electrical connecting point (VP) by means of a first signal input (E1) and is configured to form a first digital voltage potential value from the first voltage potential ($\Phi 1$).

In some embodiments, the analog-to-digital converter (AD) is electrically connected to the negative power connection terminal (NA) of the one or of one of the at least two battery cells (Z1) by means of a second signal input (E2) and is also configured to form a second digital voltage potential value from the second voltage potential ($\Phi 2$) and to form the measurement voltage from the first and the second digital voltage potential value.

In some embodiments, the measuring arrangement (MA) also comprises a filter (FT1), which is electrically connected between the electrical connecting point (VP) and the analog-to-digital converter (AD) and is configured to suppress AC potential components in the first voltage potential ($\Phi 1$).

In some embodiments, the measuring arrangement also comprises a controllable bypass switch (T2), which is electrically connected between the electrical connecting point (VP) and the analog-to-digital converter (AD) and in parallel with the filter (FT1) and is configured to bypass the filter (FT1) in a closed switching state.

As another example, some embodiments include a method for identifying a faulty state of the at least one voltage balancing circuit (SA), in particular of the measuring arrangement (MA) at the at least one voltage balancing circuit (SA), as described above, comprising the following steps: opening (S100) of the balancing switch (T1); detection (S200) of a first measurement voltage (Um1) at the one or one of the at least two battery cells (Z1); closing (S300) of the balancing switch (T1); detection (S400) of a second measurement voltage (Um2) at the one or one of the at least two battery cells (Z1); formation (S500) of a voltage difference (Ud) between the first (Um1) and the second (Um2) measurement voltage; checking (S600) of whether the voltage difference (Ud) is in a prescribed voltage tolerance range (Ub); and identification (S700) of a fault in the at least one voltage balancing circuit (SA) or in the electrical connection to the one or to one of the at least two battery cells (Z1) if the voltage difference (Ud) is outside of the prescribed voltage tolerance range (Ub).

Some embodiments also include: closing (S310) of the bypass switch (T2 and/or T3); wherein the step of detection (S400) of the second measurement voltage (Um2) also makes provision for the second measurement voltage (Um2) to be measured when the bypass switch (T2 and/or T3) is closed.

In some embodiments, the at least one voltage balancing circuit (SA) comprises a further filter (FT2), which is electrically connected between the negative power connection terminal (NA) and the second signal input (E2) of the analog-to-digital converter (AD), wherein the method makes provision for further measurement voltages to be measured for the purpose of further checking of whether a possible fault is caused by a deviating cutoff frequency of one of the two filters (FT1, FT2) while the balancing switch (T1) is closed and in each case one of the two bypass switches (T2; T3) or the two bypass switches (T2, T3) are open.

As another example, some embodiments include an electrical drive arrangement (EA), in particular for driving a hybrid electric vehicle/electric vehicle, comprising: an electric machine (EM) for electrical driving; a power output stage (LE) for operating the electric machine (EM); and a battery system (BS) as described above for providing electrical energy for the electric machine (EM); wherein the battery system (BS) is electrically connected to the power output stage (LE) by means of electrical connection terminals (A1, A2) and also to the electric machine (EM) by means of the power output stage (LE).

BRIEF DESCRIPTION OF THE DRAWINGS

Exemplary embodiments of the teachings herein are explained in more detail below with reference to the appended drawings, in which.

DETAILED DESCRIPTION

Figure 1:
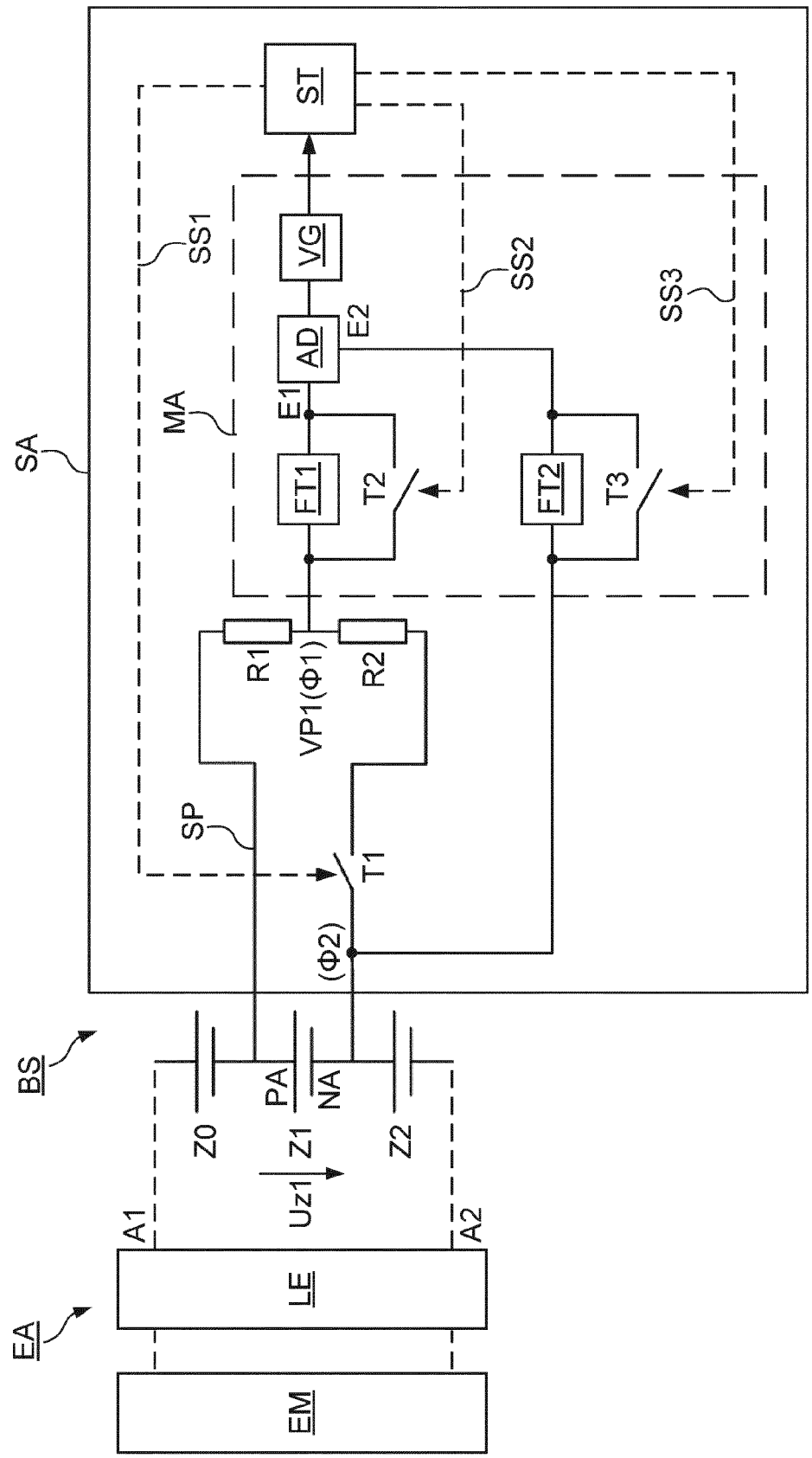
FIG. 1 shows a schematic illustration of an electrical drive arrangement having a battery system having a voltage balancing circuit in accordance with teachings of the present disclosure.

In some embodiments, the battery system comprises one or at least two battery cells (or battery cell blocks) connected in series and at least one voltage balancing circuit, which is configured to balance the voltage at the one or at one of the at least two battery cells connected in series. The voltage balancing circuit comprises a balancing current path and a measuring arrangement. In this case, the balancing current path is electrically connected between a positive power connection terminal and a negative power connection terminal of the one or of one of the at least two battery cells. The balancing current path comprises at least two resistors and a controllable balancing switch. In this case, the at least two resistors and the balancing switch are connected in series with one another in the balancing current path. The measuring arrangement is electrically connected on the signal-input side to an electrical connecting point between the two resistors and is configured to detect a first voltage potential at the electrical connecting point.

Through the use of two resistors connected in series with one another as cell voltage balancing resistors instead of just one resistor, a further measurement point (that is to say the connecting point between the at least two resistors) at which a voltage potential (or a voltage) can be measured precisely is produced in the (charge) balancing current path between the two power connection terminals of the battery cell that is to be balanced. In this case, the measured voltage potential based on the voltage potential at the negative power connection terminal of the battery cell that is to be balanced is the same level as the cell voltage and is therefore dependent on the state of charge of said battery cell when the controllable balancing switch is open. If the balancing switch is closed and the process of battery balancing is initiated, the measured voltage potential is lower than the cell voltage on account of the voltage distribution due to the resistors connected in series.

If the voltage potential measured at the connecting point deviates from a prescribed target value range, battery balancing is initiated by closing the balancing switch. If the battery balancing is initiated by closing the balancing switch, the voltage potential or the voltage at the connecting point will be lower than the cell voltage of the battery cell that is to be balanced. During battery balancing, the voltage potential at the connecting point is measured further. After a certain time, the battery balancing is interrupted by opening the balancing switch. If the battery balancing is interrupted, no current flows through the balancing current path and the voltage potential or the voltage corresponds again to the cell voltage of the corresponding battery cell.

In some embodiments, the battery cells (or battery cell blocks) of a battery system, in particular a traction battery of a hybrid electric vehicle/electric vehicle, are allowed to be operated only in certain voltage limits, since they otherwise age significantly more quickly or can even cause a thermal reaction, for example in the form of a fire. This thermal reaction should be avoided. To this end, the switching-off of the battery system in the case of overvoltage or undervoltage has to be developed in accordance with high safety standards. In order to ensure this, a redundant cell voltage measurement could be performed in order to prevent single errors, since possible errors from the cell linking up to the evaluation cannot be identified in their entirety by a diagnosis function.

Owing to different manufacturing tolerances and different aging processes, the individual battery cells also have fluctuations in their charge capacitances and internal resistances. On account of the series circuit, the different charge capacitances and the different internal resistances again lead to the battery cells being charged and discharged differently and in extreme cases being able to occupy critical states of charge (for example by overcharging). In order to avoid critical states of charge in the battery cells, the respective present charge voltages have to be measured reliably at the individual battery cells and, where necessary, the states of charge thereof have to be balanced (battery balancing).

In this case, the two functions described above should be combined in one functional unit in order to reduce installation space and production costs in the battery system. In some embodiments, the battery system is provided with at least one voltage balancing circuit, which comprises a balancing current path for battery balancing and a measuring arrangement, wherein the measuring arrangement serves for the reliable voltage measurement of the cell voltages and thus for the reliable battery balancing. A battery system having a reliable voltage measurement is thus provided by the combination with a voltage balancing circuit, which battery system can be produced in a cost-effective manner and can also be operated reliably thanks to the double function of the measuring arrangement, namely the reliable voltage measurement of the cell voltages and the reliable battery balancing.

In some embodiments, the measuring arrangement is electrically connected on the signal-input side to the negative power connection terminal of the one or of one of the at least two battery cells and is also configured to detect a second voltage potential at the negative power connection terminal. The measuring arrangement may include an analog-to-digital converter, which is electrically connected to the electrical connecting point by means of a first signal input and is configured to form a first digital voltage potential value from the first voltage potential.

In some embodiments, the analog-to-digital converter may be electrically connected to the negative power connection terminal of the one or of one of the at least two battery cells by means of a second signal input and is also configured to form a second digital voltage potential value from the second voltage potential and to form the measurement voltage from the first and the second digital voltage potential value.

In some embodiments, the measuring arrangement comprises a filter, which is electrically connected between the electrical connecting point and the analog-to-digital converter and is configured to filter or to suppress AC potential components in the first voltage potential. In some embodiments, the measuring arrangement comprises a controllable bypass switch, which is electrically connected between the electrical connecting point and the analog-to-digital converter and in parallel with the filter and is configured, in a closed switching state, to electrically short the electrical connecting point with the analog-to-digital converter and thus to bypass the filter.

In some embodiments, the battery system comprises a control arrangement, which is connected downstream of the measuring arrangement and is configured to close the balancing switch, to initiate the battery balancing thereby and thus to generate an amended expected value of the cell voltage.

In some embodiments, to identify the faulty state of the voltage balancing circuit, the balancing switch is opened. While the balancing switch remains open, a first measurement voltage is detected at the one or at one of the at least two battery cells. The balancing switch is then closed. While the balancing switch remains closed, a second measurement voltage is detected at the one or at one of the at least two battery cells. A voltage difference between the first and the second measurement voltage is then formed. A check is then carried out to determine whether the voltage difference is in a prescribed voltage tolerance range. If the voltage difference is outside of the prescribed voltage tolerance range, it is assumed that there is a fault in the voltage measuring chain. This includes, inter alia, a faulty cell connection to the measuring arrangement, a faulty voltage balancing circuit, where applicable also a faulty analog-to-digital converter and subsequent digital processing or in the electrical connection of the one or of one of the at least two battery cells.

In some embodiments, the bypass switch is closed while the second measurement voltage is measured. The second measurement voltage is thus measured when the balancing switch is closed and when the bypass switch is closed. If unexpected leakage currents caused by a fault should flow through the filter, said voltage is reduced when the bypass switch is closed, which leads to a change in the voltage difference mentioned above, which is thus outside of the target value range. This ensures that unexpected leakage currents through the filter do not allow an additional voltage to be dropped across the filter, which additional voltage would lead to an unidentified reduction in the measured cell voltage.

In some embodiments, an electrical drive arrangement comprises an electric machine for electrical driving, in particular of the hybrid electric vehicle/electric vehicle, and also a power output stage for operating the electric machine. The electrical drive arrangement also comprises a battery system described above for providing electrical energy for the electric machine. In this case, the battery system is electrically connected to the power output stage by means of electrical connection terminals and also to the electric machine by means of the power output stage. Advantageous configurations of the battery system described above, insofar as they are applicable to the electrical drive arrangement mentioned above, should also be regarded as advantageous configurations of the electrical drive arrangement.

FIG. 1 shows a schematic circuit topology of an electrical drive arrangement EA for driving an electric vehicle according to teachings of the present disclosure. The electrical drive arrangement EA comprises an electric machine EM for driving the electric vehicle, a power output stage LE for operating the electric machine EM, and also a battery system BS, which, as a traction battery, provides electrical energy for the electric machine EM.

The battery system BS is electrically connected to the power output stage LE by means of two electrical connection terminals A1, A2 and also to the electric machine EM by means of the power output stage LE. The battery system BS comprises a number of battery cells Z0, Z1, Z2, which are connected in series between the electrical connection terminals A1, A2.

The battery system BS also comprises a voltage balancing circuit SA, which for its part comprises a balancing current path SP, by means of which the voltage balancing circuit SA is electrically connected to a positive power connection terminal PA and to a negative power connection terminal NA of one of the battery cells Z0, Z1, Z2.

The voltage balancing circuit SA may comprise further balancing current paths, which are electrically connected to positive and negative power connection terminals of the respective other battery cells Z0, Z2. Said balancing current paths function in an analogous manner to the balancing current path SP described above and to be described in detail below.

The balancing current path SP comprises two electrical resistors R1, R2 and a controllable balancing switch T1, wherein the two resistors R1, R2 and the balancing switch T1 are connected in series with one another in the balancing current path SP.

The voltage balancing circuit SA also comprises a measuring arrangement MA, which for its part comprises an analog-to-digital converter AD, a first and/or a second filter FT1, FT2 and (optionally) a first and/or a second controllable bypass switch T2, T3. The analog-to-digital converter AD has a first and a second signal input E1, E2 and is electrically connected to the connecting point VP by means of the first signal input E1 and to the negative power connection terminal NA by means of the second signal input E2.

In some embodiments, the analog-to-digital converter AD is configured to detect a first voltage potential at the connecting point VP and a second voltage potential at the negative power connection terminal NA and to form an analog potential difference from the two voltage potentials and to convert said analog potential difference to a digital measurement voltage.

In some embodiments, the first filter FT1 is electrically connected between the connecting point VP and the first signal input E1 of the analog-to-digital converter AD. The first filter FT1 is designed as a low-pass filter and is configured to suppress potential fluctuations in the first voltage potential in order to prevent signal subsampling.

In some embodiments, the first bypass switch T2 is likewise electrically connected between the connecting point VP and the first signal input E1 of the analog-to-digital converter AD and thus in parallel with the first filter FT1 and is configured, in a closed switching state, to electrically short the connecting point VP with the first signal input E1 and thus to bypass the first filter FT1.

In some embodiments, the second filter FT2 is electrically connected between the negative power connection terminal NA and the second signal input E2 of the analog-to-digital converter AD. The second filter FT2 is likewise designed as a low-pass filter and is configured to suppress potential fluctuations in the second voltage potential in order to prevent signal subsampling.

In some embodiments, the second bypass switch T3 is likewise electrically connected between the negative power connection terminal NA and the second signal input E2 of the analog-to-digital converter AD and thus in parallel with the second filter FT2 and is configured, in a closed switching state, to electrically short the negative power connection terminal NA with the second signal input E2 and thus to bypass the second filter FT2.

In some embodiments, he voltage balancing circuit SA comprises a control arrangement ST for actuating the balancing switch T1 and the two bypass switches T2, T3. The control arrangement ST comprises, for example, a signal input and three signal outputs. The control arrangement ST is electrically connected to a signal output of the analog-to-digital converter AD by means of the signal input. The control arrangement ST is in each case electrically connected to the control connection terminal of the balancing switch T1 and the control connection terminals of the two bypass switches T2, T3 by means of in each case one of the signal outputs. Furthermore, the bypass switch T2 and/or T3 can also be controlled directly by the voltage across the resistor R1 or R2. After the circuit topology of the battery system BS has been described in detail with reference to FIG. 1, the functioning of the battery system BS, in particular of the voltage balancing circuit SA, is described in more detail below:

To balance the cell voltage at the battery cells Z0, Z1, Z2, the measuring arrangement MA measures the voltage potential $\Phi 1$ at the connecting point VP and the voltage potential $\Phi 2$ at the negative power connection terminal NA. In this case, the two filters FT1, FT2 suppress the "high-frequency" potential fluctuations in the measured voltage potentials $\Phi 1$, $\Phi 2$. In this case, cutoff frequencies are determined for both filters FT1, FT2 in such a way that the "high-frequency" potential fluctuations at a frequency above the set cutoff frequencies are reduced but at the same time the tolerances of the cell voltage measurement that are to be taken into account do not increase substantially on account of the fluctuations when the balancing switch T1 is closed and opened.

In some embodiments, the analog-to-digital converter AD initially forms from the filtered voltage potentials $\Phi 1$, $\Phi 2$ a potential difference as an analog measurement voltage and, in a subsequent sampling, forms a digital measurement voltage and transmits said digital measurement voltage to the downstream comparison unit VG. The comparison unit VG compares the digital measurement voltage with a prescribed reference voltage. If the measurement voltage exceeds the reference voltage, a signal is output to the control arrangement ST, which consequently generates a control signal SS1 and closes the balancing switch T1 in a manner actuated using said control signal. The closed balancing switch T1 forms a closed circuit through the balancing current path SP, by way of which the battery cell Z1 discharges and the cell voltage at the battery cell Z1 is reduced and thus balanced.

Figure 2:
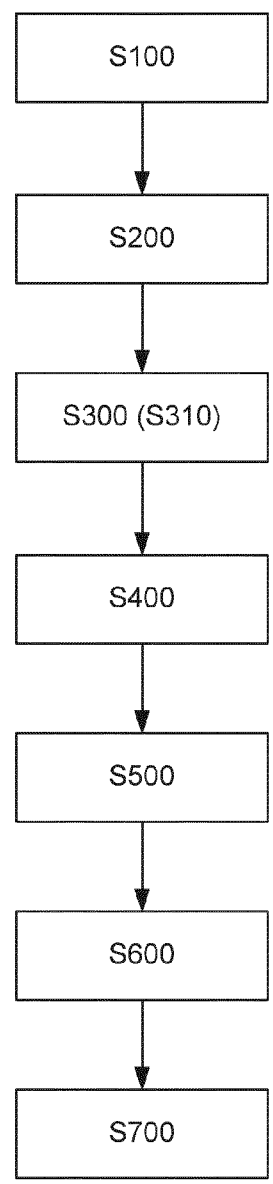
FIG. 2 shows a schematic flowchart of a method for identifying a faulty state of the voltage measuring circuit, in particular of the measuring arrangement of the voltage measuring circuit, of the battery system illustrated in FIG. 1.

In some embodiments, during the discharge process, the state of charge of the battery cell Z1 is further detected through further measurement of the voltage potential $\Phi 1$ at the first connecting point VP1 and the digital measurement voltage is formed therefrom. The operability or the identification of a faulty state of the voltage balancing circuit SA, in particular of the measuring arrangement MA, is monitored as described below, which is also illustrated in FIG. 2:

To identify a faulty state of the voltage balancing circuit SA, in particular of the measuring arrangement MA, the control arrangement ST opens the balancing switch T1, if it is closed, in accordance with a method step S100 by changing the signal level of the control signal SS1. While the balancing switch T1 is in the open switching state, the measuring arrangement MA detects a first digital measurement voltage Um1 at the battery cell Z1 in accordance with a further method step S200 and in the manner described above. After the first measurement voltage Um1 has been detected, the control arrangement ST closes the balancing switch T1 in a further method step S300 by changing the signal level of the control signal SS1.

At the same time, the control arrangement ST closes the bypass switches T2 and/or T3 in accordance with a further method step S310 by means of further control signals SS2, SS3. The two bypass switches T2 and T3 can also be concomitantly closed through the closure of the balancing switch T1 by the change in voltage across one of the two resistors R1 and R2. While the balancing switch T1 is in the closed switching state optionally together with the bypass switch T2 and/or T3, the measuring arrangement MA detects a second digital measurement voltage Um2 at the battery cell Z1 in accordance with a further method step S400 and in the same manner. In some embodiments, the measuring arrangement MA then forms a voltage difference Ud between the first and the second measurement voltage Um1, Um2 in accordance with a further method step S500 and transmits the voltage difference Ud to the downstream comparison unit VG. The comparison unit VG checks whether the voltage difference Ud is in a prescribed voltage tolerance range Ub in accordance with a further method step S600. To this end, the comparison unit VG compares the voltage difference Ud with the two limit values of the voltage tolerance range Ub. If the voltage difference Ud is outside of the prescribed voltage tolerance range Ub, a possible fault in the voltage balancing circuit SA, in particular in the measuring arrangement MA, is assumed in accordance with a further method step S700.

For further checking of whether the possible fault is caused by a deviating cutoff frequency of one of the two filters FT1, FT2, further measurement voltages are measured while the balancing switch T1 is closed and in each case one of the two bypass switches T2, T3 or both bypass switches T2 and T3 are open. In some embodiments, further voltage differences are formed from the further measurement voltages measured in this way and the first measurement voltage Um1 and a check is carried out to determine whether said further voltage differences are in the aforementioned voltage tolerance range Ub. If this is the case, the source of the fault detected above is possibly located in the filter FT1 or FT2 whose bypass switch T2 or T3 was open during the measurement of the corresponding further measurement voltage. In contrast, if said further voltage differences are in the mentioned voltage tolerance range Ub, the fault is located in the voltage balancing circuit SA or in the measuring arrangement MA.

The invention claimed is:

1. A battery system comprising:
   a battery cell; and
   a voltage balancing circuit for balancing a voltage at the battery cell;
   wherein the voltage balancing circuit includes:
   a balancing current path electrically connected between a positive power connection terminal and a negative power connection terminal of the battery cell, two resistors, and a controllable balancing switch connected in series with the two resistors; and a measuring arrangement electrically connected on a signal-input side to an electrical connecting point between the two resistors and configured to detect a first voltage potential at the electrical connecting point;

wherein the measuring arrangement comprises:
an analog-to-digital converter electrically connected to the electrical connecting point by a first signal input and configured to form a first digital voltage potential value from the first voltage potential;
a filter electrically connected between the electrical connecting point and the analog-to-digital converter and configured to suppress AC potential components in the first voltage potential; and
a controllable bypass switch electrically connected between the electrical connecting point and the analog-to-digital converter in parallel with the filter and configured to bypass the filter in a closed switching state.

2. The battery system as claimed in claim 1, wherein the measuring arrangement is electrically connected on the signal-input side to the negative power connection terminal of the battery cell and is configured to detect a second voltage potential at the negative power connection terminal.

3. The battery system as claimed in claim 1, wherein the analog-to-digital converter is electrically connected to the negative power connection terminal of the battery cell by a second signal input and is configured to:
form a second digital voltage potential value from the second voltage potential; and
form the measurement voltage from the first and the second digital voltage potential value.

4. A method for identifying a faulty state of a voltage balancing circuit comprising a balancing current path electrically connected between a positive power connection terminal and a negative power connection terminal of a battery cell, two resistors, and a balancing switch connected in series with the two resistors, and a measuring arrangement electrically connected on a signal-input side to an electrical connecting point between the two resistors and configured to detect a first voltage potential at the electrical connecting point, an analog-to-digital converter electrically connected to the electrical connecting point by a first signal input and configured to form a first digital voltage potential value from the first voltage potential, and a filter electrically connected between the electrical connecting point and the analog-to-digital converter and configured to suppress AC potential components in the first voltage potential, a controllable bypass switch electrically connected between the electrical connecting point and the analog-to-digital converter in parallel with the filter and configured to bypass the filter in a closed switching state, and a further filter electrically connected between the negative power connection terminal and the second signal input of the analog-to-digital converter, the method comprising:

opening the balancing switch;
detecting a first measurement voltage at the battery cell;
closing the balancing switch;
detecting a second measurement voltage at the battery cell;
calculating a voltage difference between the first and the second measurement voltage;
comparing the voltage difference to a prescribed voltage tolerance range;
identifying a fault in the voltage balancing circuit or in the electrical connection to the battery cell if the voltage difference is outside of the prescribed voltage tolerance range;
wherein detecting the second measurement voltage includes measuring the second measurement voltage when the bypass switch is closed; and
measuring further voltages for checking of a possible fault caused by a deviating cutoff frequency of one of the two filters while the balancing switch is closed and the bypass switch is open.

5. An electrical drive arrangement comprising:
an electric machine for electrical driving;
a power output stage for operating the electric machine;
a battery system for providing electrical energy for the electric machine, the battery system comprising:
a battery cell; and
a voltage balancing circuit for balancing a voltage at the one;
wherein the voltage balancing circuit includes:
a balancing current path electrically connected between a positive power connection terminal and a negative power connection terminal of the battery cell, two resistors, and a controllable balancing switch connected in series with the two resistors; and
a measuring arrangement electrically connected on a signal-input side to an electrical connecting point between the two resistors and configured to detect a first voltage potential at the electrical connecting point;
wherein the battery system is electrically connected to the power output stage by electrical connection terminals and to the electric machine by the power output stage;
wherein the measuring arrangement comprises:
an analog-to-digital converter electrically connected to the electrical connecting point by a first signal input and configured to form a first digital voltage potential value from the first voltage potential;
a filter electrically connected between the electrical connecting point and the analog-to-digital converter and configured to suppress AC potential components in the first voltage potential; and
a controllable bypass switch electrically connected between the electrical connecting point and the analog-to-digital converter in parallel with the filter and configured to bypass the filter in a closed switching state.

* * * * *